(12) United States Patent
Bardy et al.

(10) Patent No.: US 11,639,646 B2
(45) Date of Patent: May 2, 2023

(54) PLANNING A WELL CONFIGURATION USING GEOMECHANICAL PARAMETERS

(71) Applicant: Landmark Graphics Corporation, Houston, TX (US)

(72) Inventors: Gaetan Bardy, Spring, TX (US); Jeffrey M. Yarus, Houston, TX (US); Harold Grayson Walters, Tomball, TX (US); Kevin B. Hall, Spring, TX (US); Shohreh Amini, Houston, TX (US); Steven James Drinovsky, Katy, TX (US); Meftun Erdogan, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 366 days.

(21) Appl. No.: 16/630,541

(22) PCT Filed: Feb. 13, 2019

(86) PCT No.: PCT/US2019/015645
§ 371 (c)(1),
(2) Date: Jan. 13, 2020

(87) PCT Pub. No.: WO2020/167282
PCT Pub. Date: Aug. 20, 2020

(65) Prior Publication Data
US 2021/0222518 A1 Jul. 22, 2021

(51) Int. Cl.
*G06F 30/27* (2020.01)
*E21B 43/26* (2006.01)
(Continued)

(52) U.S. Cl.
CPC .............. *E21B 41/00* (2013.01); *E21B 43/26* (2013.01); *E21B 49/087* (2013.01);
(Continued)

(58) Field of Classification Search
CPC ........ E21B 41/00; E21B 43/26; E21B 49/087; E21B 2200/20; E21B 2200/22;
(Continued)

(56) References Cited

U.S. PATENT DOCUMENTS 8,126,689 B2 2/2012 Soliman et al.
8,812,334 B2 8/2014 Givens et al.
(Continued)

OTHER PUBLICATIONS

Mansouri, Vahid, et al. "3-D well path design using a multi objective genetic algorithm." Journal of natural gas science and engineering 27 (2015). pp. 219-235. (Year: 2015).*
(Continued)

*Primary Examiner* — John E Johansen
(74) *Attorney, Agent, or Firm* — Kilpatrick Townsend & Stockton LLP

(57) ABSTRACT

Geomechanical parameters can be used to optimize a well configuration that includes one or more projected wells having locations and geometries. Formation data and regional stress information of a formation can be used to determine a local stress variation of the formation. A quality index can be generated by combining petrophysical properties with the local stress variation. Hydrocarbon recovery flow simulations can be generated by generating well configuration models based on the quality index, generating reservoir geomechanical model that includes hydraulic fracture propagation characteristics, determining new hydraulic fractures by simulating propagation through the reservoir geomechanical model and using geomechanical rules, and determining a projected hydrocarbon recovery rate by simulating flow with the new hydraulic fractures. A well placement plan can be selected using the projected hydrocarbon recovery rates. The well placement plan can be output to be used to plan one or more wellbores.

18 Claims, 6 Drawing Sheets

(51) Int. Cl.
*E21B 49/08* (2006.01)
*G01V 99/00* (2009.01)
*E21B 41/00* (2006.01)
*G06Q 10/04* (2012.01)
*G06Q 50/02* (2012.01)
*G06N 20/00* (2019.01)

(52) U.S. Cl.
CPC ............ *G01V 99/005* (2013.01); *G06F 30/27* (2020.01); *E21B 2200/20* (2020.05); *E21B 2200/22* (2020.05); *G06N 20/00* (2019.01); *G06Q 10/04* (2013.01); *G06Q 50/02* (2013.01)

(58) Field of Classification Search
CPC ...... G01V 99/005; G06F 30/27; G06N 20/00; G06Q 10/04; G06Q 50/02
USPC ......................................................... 703/10
See application file for complete search history.

(56) References Cited

U.S. PATENT DOCUMENTS

| | | | |
|---|---|---|---|
| 9,135,475 B2* | 9/2015 | Lecerf | G06G 7/50 |
| 9,376,902 B2 | 6/2016 | Prioul et al. | |
| 9,645,281 B2 | 5/2017 | Srivastava et al. | |
| 9,890,616 B2 | 2/2018 | Pabon et al. | |
| 2016/0139588 A1 | 5/2016 | Huang et al. | |
| 2016/0161933 A1 | 6/2016 | Chok et al. | |
| 2016/0357883 A1 | 12/2016 | Weng et al. | |
| 2017/0038489 A1 | 2/2017 | Pandey et al. | |
| 2017/0051598 A1 | 2/2017 | Ouenes | |
| 2017/0145793 A1* | 5/2017 | Ouenes | E21B 43/26 |
| 2018/0016895 A1 | 1/2018 | Weng et al. | |
| 2018/0266244 A1 | 9/2018 | Kanneganti | |
| 2018/0269668 A1 | 9/2018 | Jolly et al. | |
| 2018/0335538 A1* | 11/2018 | Dupont | G06Q 10/04 |

OTHER PUBLICATIONS

Xu, Chengyuan, et al. "An experimental study on porosity and permeability stress-sensitive behavior of sandstone under hydrostatic compression: characteristics, mechanisms and controlling factors." Rock Mechanics and Rock Engineering 51.8 (2018). pp. 2321-2338. (Year: 2018).*

Holbrook, Phil. "The Relationship Between Porosity, Mineralogy, and Effective Stress in Granular Sedimentary Rocks." SPWLA 36th Annual Logging Symposium. OnePetro, 1995. pp. 1-12. (Year: 1995).*

Letham, Eric Aidan, and Robert Marc Bustin. "The impact of gas slippage on permeability effective stress laws: implications for predicting permeability of fine-grained lithologies." International Journal of Coal Geology 167 (2016). pp. 93-102. (Year: 2016).*

International Application No. PCT/US2019/015645, International Search Report and Written Opinion, dated Oct. 25, 2019, 10 pages.

* cited by examiner

PLANNING A WELL CONFIGURATION USING GEOMECHANICAL PARAMETERS

TECHNICAL FIELD

The present disclosure relates generally to a wellbore environment for extracting hydrocarbons. More specifically, but not by way of limitation, this disclosure relates to planning a configuration of a wellbore in a subterranean formation based on geomechanical parameters.

BACKGROUND

Placing a well in a geological region and the configuration of that well within a subterranean formation can be important in achieving an as efficient well as possible. A reservoir containing hydrocarbons can be located within a geographical area such that multiple wells may be drilled to obtain hydrocarbons from a reservoir. Configuring the wells to be drilled, including location and geometry of the wells, can be useful in obtaining the hydrocarbons from the reservoir at high rates as quickly as possible. Placing a well poorly with respect to the reservoir, or drilling a well with a non-ideal geometry can cause poor hydrocarbon recovery rates that can require a longer time to deplete a reservoir of hydrocarbons.

DETAILED DESCRIPTION

Figure 1:
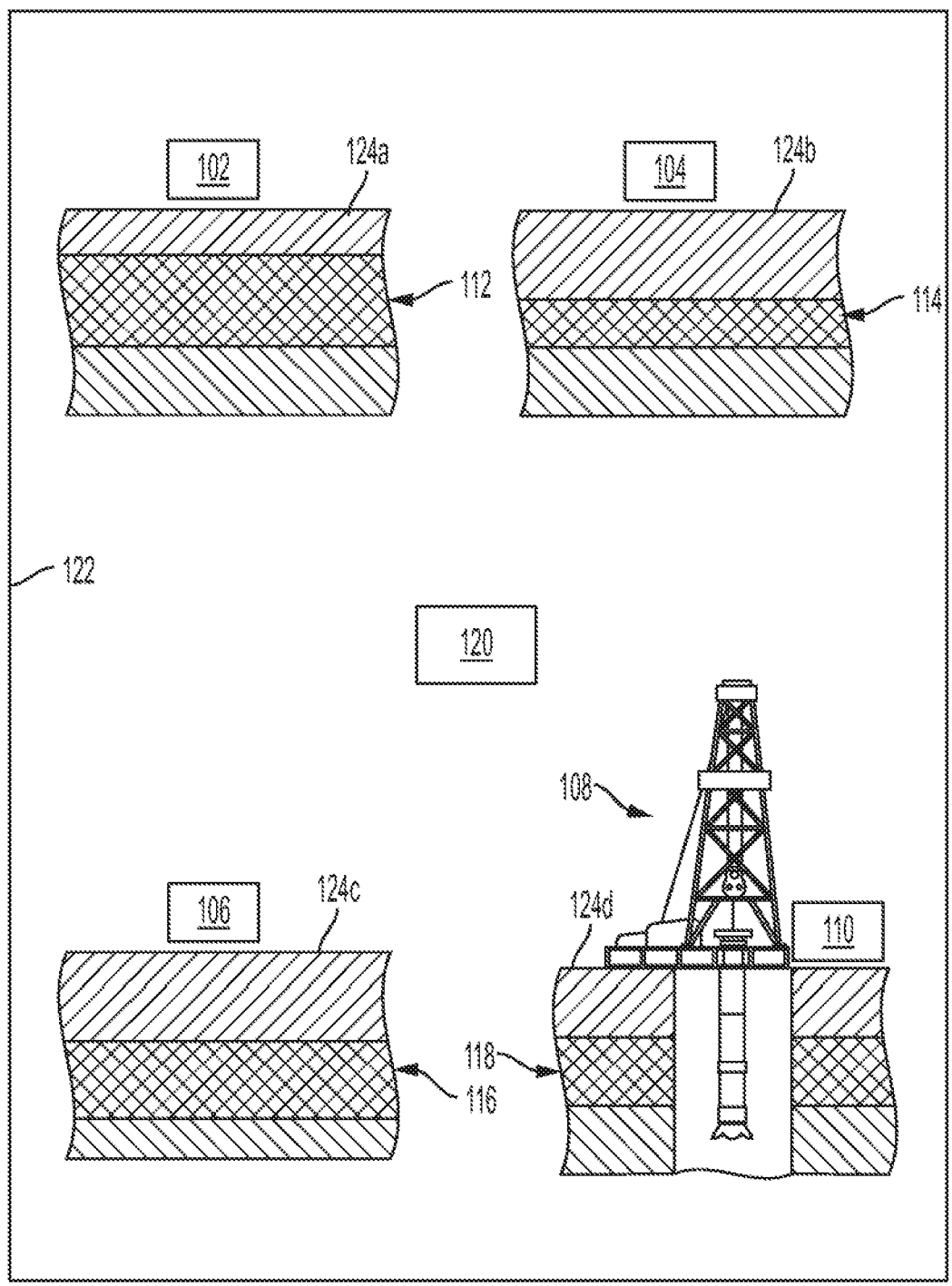
FIG. 1 is a cross-sectional view of an example of a geographical region to be drilled based on geomechanical parameters according to some aspects of the present disclosure.

Certain aspects and features relate to planning a configuration of a wellbore in a subterranean formation based on geomechanical parameters. Geomechanical parameters can include quantitative or qualitative measures that represent how rocks, stresses, pressures, and temperatures interact. Geomechanical parameters can be useful in determining fracturing efficiency and wellbore stability. Examples of geomechanical parameters can include stress, strain, and elastic properties of a subterranean formation. Sensors can be used to measure formation data including a natural fracture network of a subterranean formation containing a reservoir of hydrocarbons, such that the natural fracture network can indicate where fracturing may most likely occur or at which it may be easiest to access the hydrocarbons. Local stress variation, which can be determined from the natural fracturing network, can be combined with petrophysical properties of the reservoir to generate a quality index that can be used to identify areas of high hydrocarbon yield. Multiple well configurations can be generated having different locations and geometries. Fracture and flow simulations can be performed for each well configuration to determine a projected hydrocarbon recovery rate for each well configuration. The well configurations and corresponding projected hydrocarbon recovery rates can be used to determine a well location and geometry for one or more wells along a reservoir.

A well-placement optimization procedure can find the best well configuration given various subterranean formation and reservoir parameters. A well configuration can include well placement or location and well geometry, including a projected three-dimensional drill path within the subterranean formation to reach the reservoir. A best well configuration can be used to maximize the hydrocarbon recovery from a reservoir. Well placement optimization techniques can use parameters such as porosity field, permeability field, well cost, and fluid properties, which can be combined with an objective function to be assign weights to each well configuration. In the context of a shale reservoir, other parameters can be more useful than parameters such as porosity and permeability in determining a best well configuration. In some reservoirs, permeability can be low and may not be useful in determining an optimal well configuration. But, geomechanical parameters can be highly variable. Using hydraulic fracturing along zones that are brittle and hydrocarbon rich can achieve a best well configuration that can create a highest hydrocarbon recovery rate.

In some examples, permeability resulting from hydraulic fractures can be considered for determining projected hydrocarbon yield rates. The properties that influence the hydraulic fracturing, along with associated distribution patterns, can be useful for determining a best well configuration. Geomechanical parameters, which can be similar to any other rock properties, can have spatial variations throughout the reservoir that can largely affect hydrocarbon recovery rates. Accounting for geomechanical parameters can be useful in determining an optimized well configuration to achieve the highest hydrocarbon recovery rates possible.

Petrophysical properties can be used to develop an understanding of the rock properties of a reservoir, particularly with respect to how pores in the subterranean formation are interconnected for controlling the accumulation and migration of hydrocarbons. A petrophysical property can represent how fluid behaves in a subterranean formation under consideration. Examples of petrophysical properties can include lithology, porosity, water saturation, permeability, and density. In some examples, petrophysical properties can be combined with geomechanical parameters and hydraulic fracture propagation to determine an optimized well configuration.

Some examples can optimize a well configuration for a new reservoir or currently producing reservoir to produce a variety of benefits with respect to overall well production efficiency, integrity, and safety. In the case of a reservoir that has yet to be operated on or drilled, an optimized well configuration can be determined based on input parameters such as the number of wells, possible well geometry, perforation configuration, fluid properties, geomechanical parameters, petrophysical properties, and natural fracture network. In the case where the reservoir has been under production, a best well configuration for additional wells can be determined using the same or similar input parameters.

From a geological point of view, well placement can be optimized and new drilling can be proposed in a region where the hydrocarbon accumulation is high. From a geomechanical point of view, the effects of hydraulic fracturing can be maximized by targeting low differential stress areas with high strain. From a drilling point of view, the projected drilling location can be ensured to meet the wellbore stability requirements to prevent wellbore failure or collapse. From a reservoir point of view, key properties of the reservoir can be modeled to optimize hydraulic fracture propagation and compute the hydrocarbon recovery.

In some examples, determining an optimized well configuration can include considering a numerical reservoir model with a natural fracture network. The porosity and permeability of the subterranean formation can be computed using sequential Gaussian simulation. The local variation of the regional stress according to the fracture network can be determined using a material point method-based algorithm. The parameters, porosity, permeability, and local stress variation, can be combined to form relationships useable to identify areas with higher porosity, higher permeability, but low differential stress. In these areas, the strain inside the reservoir for a given well configuration can be computed. This approach can enable determining the hydraulic fracture propagation potential and then the corresponding hydrocarbon recovery using a numerical flow simulator. The best configuration for a given number of wells can be identified.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional view of a geographical region 122 to be drilled based on geomechanical parameters according to some examples of the present disclosure. The geographical region 122 can have regional stress patterns, which can be accounted for when determining a stress variation for a local area within the geographical region 122. Regional stress patterns can include regional constraints such as tectonic plate movements and direction. The regional stress patterns can be accounted for when determining the local stress variation for an area located within the geographical region 122. Placement of one or more wells within the geographical region 122 can be impacted more significantly by local stress variations as compared to regional stress patterns. For example, the geographical region 122 can have a regional stress pattern that is consistent throughout the all areas, but there may exist hundreds of variations to the stress at any given local area defined as a portion of the geographical region 122. In some examples, regional stress patterns can be ignored due to their insignificant impact on well placement optimization. In some examples, regional stress patterns and local stress variation can be used to determine the ultimate placement of a well in the geographical region 122.

The geographical region 122 can include various subterranean formations 112, 114, 116, 118 having different physical characteristics, such as size, permeability, porosity, and geographical orientation. The subterranean formations 112, 114, 116, 118 can be located within a single local area containing a reservoir, or can be located at different localized areas within the geographical region 122, such that the different localized areas can include one or more separate reservoirs. For example, the subterranean formations 112, 114, 116, 118 can be connected by a single reservoir bearing hydrocarbons, where the subterranean formations 112, 114, 116, 118 are within a single localized area. As another example, the subterranean formations 112, 114 can be connected by a reservoir within one local area, and the subterranean formations 116, 118 can be connected by another reservoir within another local area in the geographical region 122. As a further example, each of the subterranean formations 112, 114, 116, 118 can be located at different local areas, each including connections to different reservoirs. The purpose of this illustration is to show that formation data, including seismic data and wellbore image logs, can be measured and recorded throughout various local areas in the geographical region 122 to determine the dimensions and properties of any feasible reservoirs, which may or may not permeate each subterranean formation scanned.

Sensors 102, 104, 106, 110 can be used to measure formation data including petrophysical properties of the subterranean formations 112, 114, 116, 118. The formation data can include information such as seismic data or image logs that can be used to build a natural fracture network. Image logs can represent fractures observed in a wellbore. The sensors 102, 104, 106, 110 can be located respectively above the subterranean formations 112, 114, 116, 118 at the surfaces 124a, 124b, 124c, 124d. The sensors 102, 104, 106, 110 can be separate devices or formation data measurement and imaging tools located at each of the surfaces 124a, 124b, 124c, 124d that correspond to different areas within the geographical region 122. In some examples, the sensors 102, 104, 106, 110 can be a single device that is transportable to measure formation data for each of the subterranean formations 112, 114, 116, 118 and other subterranean formations.

A well optimization system 120 can be used to gather and store formation data or other information related to well planning, drilling, and production phases from the sensors 102, 104, 106, 110. The well optimization system 120 can optimize a well configuration, as described in examples. The well optimization system 120 can be communicatively coupled to the sensors 102, 104, 106, 110 to receive formation data measured by the sensors 102, 104, 106, 110. In some examples, the sensors 102, 104, 106, 110 can store the formation data measured in separate databases, then connect to the well optimization system 120 to transfer the formation data to the well optimization system 120 for processing. For example, the sensors 102, 104, 106, 110 can be communicatively coupled to the well optimization system 120 through a wireless network, or can communicate with the well optimization system 120 indirectly through various network devices. As another example, the sensors 102, 104, 106, 110 can store formation data on local devices or memory which can be electrically connected to the well optimization system 120 (e.g., in a laboratory or testing environment).

A subterranean formation containing a reservoir of hydrocarbons can have a natural fracture network where fracturing may most likely occur. The formation data measured by the sensors 102, 104, 106, 110 can be used to determine the natural fracturing network. Three-dimensional models of the subterranean formations 112, 114, 116, 118 can be generated by the well optimization system 120 using the formation data measured by the sensors 102, 104, 106, 110. The three-dimensional models can illustrate the natural fracture network, which can be used alongside the regional stress information of the geographical region 122 to determine, via the well optimization system 120, the local stress variation. The local stress variation, or geomechanical strip, can be defined as the difference between the maximum and minimum stress within an area. The local stress variation can be used as a baseline for considering geomechanical parameters when determining an optimized well configuration.

Assuming the example in which the subterranean formations 112, 114, 116, 118 are connected by a single reservoir, as determined by one or more sensors located above each of the subterranean formations 112, 114, 116, 118, an optimized well configuration can be determined by the well optimization system 120. The optimized well configuration can include one or more wellbores to be drilled through the subterranean formations 112, 114, 116, 118, or at areas along the reservoir, to obtain a highest possible hydrocarbon recovery rate. The subterranean formations 112, 114, 116, 118 can have different petrophysical properties and three-dimensional characteristics.

For example, the reservoir that can be sensed within the subterranean formations 112, 114, 116, 118 can have different petrophysical properties and three-dimensional characteristics along various areas. For example, the area of the reservoir that can be detectable beneath the surface 124a by the sensor 102 can include a larger volume of hydrocarbons than the area of the reservoir that can be detectable beneath the surface 124b by the sensor 104. By determining the extent of the reservoir through mapping a complete picture of the subterranean formations within a local area, a basic understanding of which locations should be drilled to achieve a highest hydrocarbon recovery rate can be determined. For example, due to the larger volume of hydrocarbons in the reservoir beneath the surface 124a as compared to volume of hydrocarbons in the reservoir beneath the surface at 124b, placing one or more wells to drill the subterranean formation 112 may achieve a higher production rate than if placing more wells to drill the subterranean formation 114.

As another example, the area of a shale reservoir that can be detectable beneath the surface 124b by the sensor 104 can have a lower differential stress and a higher strain than the area of the shale reservoir that can be detectable beneath the surface 124c by the sensor 106. The well optimization system 120 can then determine that hydrocarbon recovery rates may be increased through additional well placements and fracturing within the subterranean formation 114. Comparatively, the well optimization system 120 can determine that an optimized well configuration includes fewer well placements and fracturing within the subterranean formation 116, since achieving high production rates may be more difficult through a subterranean formation with high differential stress and low strain.

In some examples, preexisting wells in the drilling or production phases can be used to provide additional data for optimizing placement of additional wells for that reservoir already producing hydrocarbons. For example, a drilling environment 108 can include a drilling rig in the drilling phase. During the drilling phase, sensors located at the surface or downhole, such as sensors attached to a tool on a drill string or sensors attached to a wireline tool, can be used to determine the actual petrophysical properties of a reservoir. Additionally, reservoir properties can be determined in the production phase. By measuring the actual properties of a reservoir, the well optimization system 120 can include the well location and geometry of the existing well in the drilling environment 108 within the optimization calculations. This can allow for the well optimization system 120 to determine additional well placements and geometries to further maximize the hydrocarbon recovery rate for that reservoir. For example, based on the well placement and geometry of the well in the drilling environment 108, the well optimization system 120 can determine that one or more wells having specific locations and geometries can maximize the existing hydrocarbon recovery rate.

Figure 2:
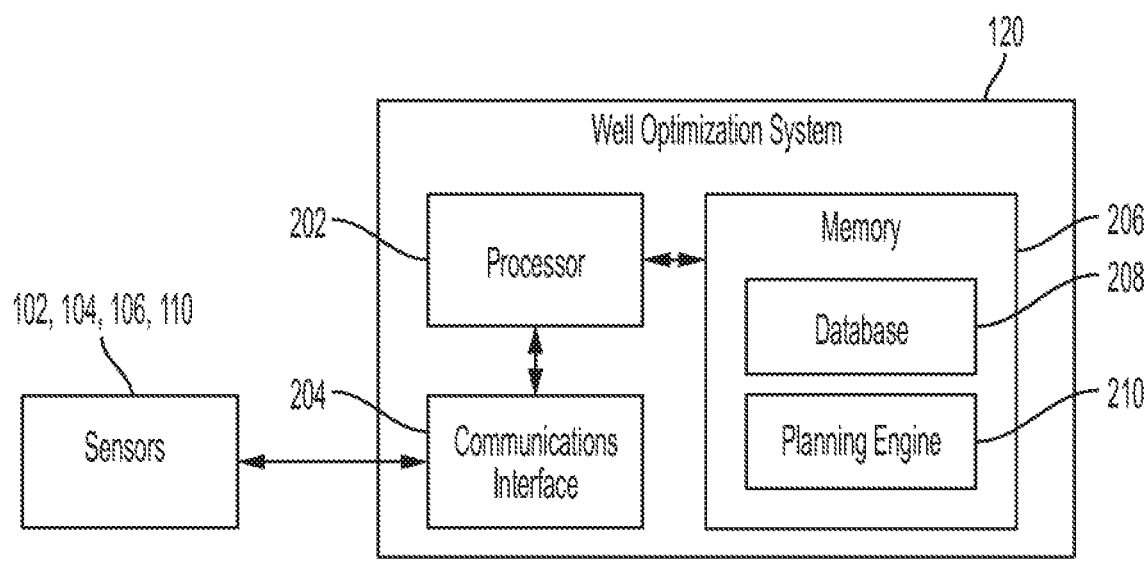
FIG. 2 is a block diagram of an example of a well optimization system according to some aspects of the present disclosure.

FIG. 2 is a block diagram of a well optimization system 120 according to some examples of the present disclosure. The well optimization system 120 can be a computing device having a processor 202, a communications interface 204, and a memory 206. In some examples, the components shown in FIG. 2 (e.g., the processor 202, the communications interface 204, and the memory 206) can be integrated into a single structure. For example, the components can be within a single housing. In other examples, the components shown in FIG. 2 can be distributed (e.g., in separate housings) and in electrical communication with each other.

The sensors 102, 104, 106, 110 can be communicatively coupled to the well optimization system 120 to transmit information about the formation data, petrophysical properties, or other measurable characteristics related to subterranean formations. The well optimization system 120 can be communicatively coupled to the sensors 102, 104, 106, 110 via the communications interface 204. The communications interface 204 can be configured to transmit the information received from the sensors 102, 104, 106, 110 to the memory 206 for storage and use as described in the examples. In some examples, the well optimization system 120 can transmit requests for data via the communications interface 204 to the sensors 102, 104, 106, 110.

The processor 202 can execute one or more operations for implementing some examples. The processor 202 can execute instructions stored in the memory 206 to perform the operations. The processor 202 can include one processing device or multiple processing devices. Non-limiting examples of the processor 202 include a Field-Programmable Gate Array ("FPGA"), an application-specific integrated circuit ("ASIC"), a microprocessor, etc.

The processor 202 can be communicatively coupled to the memory 206 via a bus. The non-volatile memory 206 may include any type of memory device that retains stored information when powered off. Non-limiting examples of the memory 206 include electrically erasable and programmable read-only memory ("EEPROM"), flash memory, or any other type of non-volatile memory. In some examples, at least some of the memory 206 can include a medium from which the processor 202 can read instructions. A computer-readable medium can include electronic, optical, magnetic, or other storage devices capable of providing the processor 202 with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

The memory 206 can include a database 208, which can include any amount and combination of the content described in previous examples. The database 208 can include formation data such as seismic data or image logs, data related to simulations, or other generated data described in examples, LWD information, or any combination of these, among other things. The memory 206 can include a Planning Engine 210, which can include instructions or code executable by the processor 202 to perform operations for selecting and outputting a well placement plan for a wellbore in an area.

Figure 3:
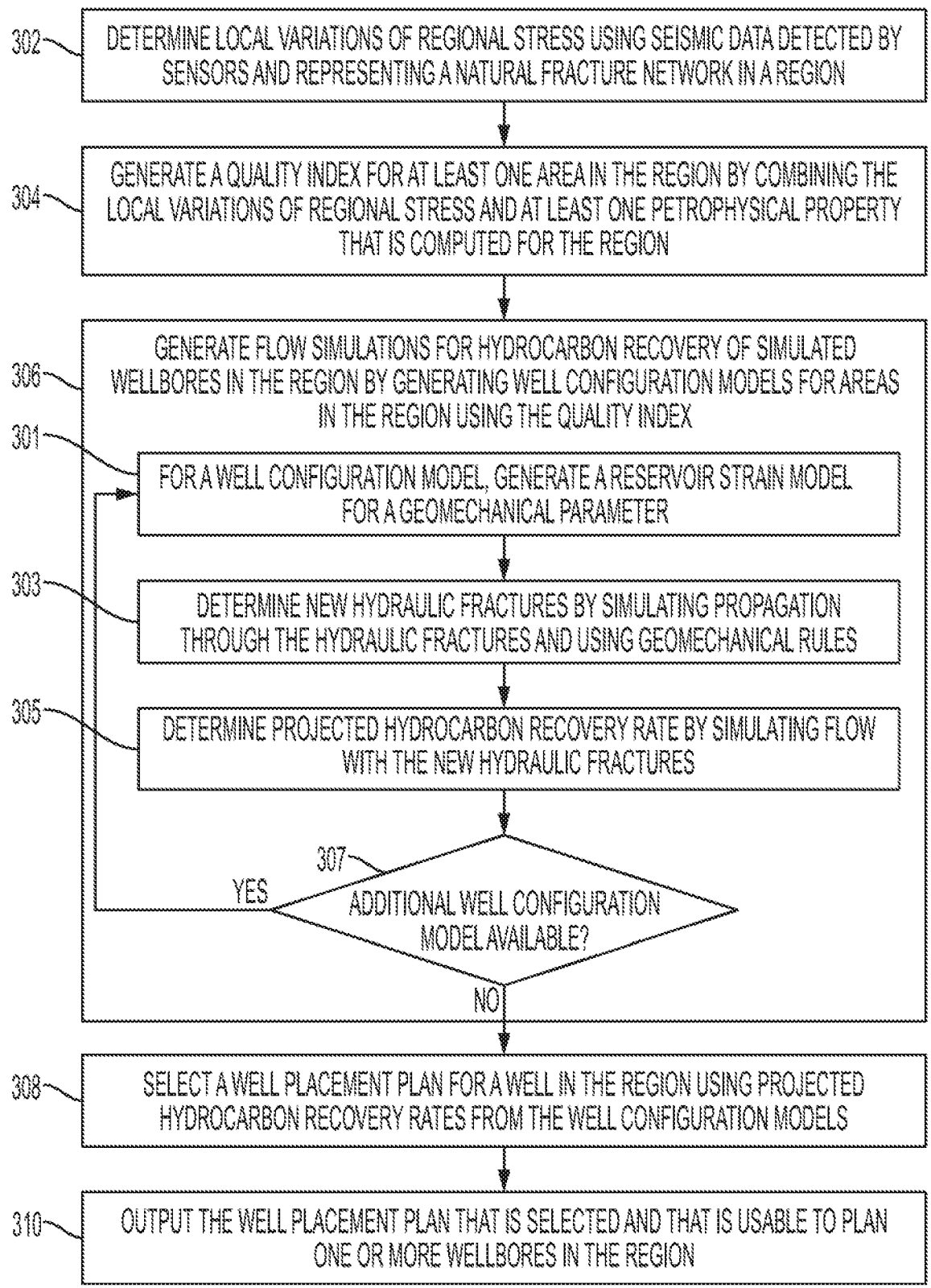

FIG. 3 is a flowchart of a process for planning a configuration of a well in a subterranean formation based on geomechanical parameters according to some examples of the present disclosure. Other examples can include more steps, fewer steps, different steps, or a different order of the steps described with respect to FIG. 3. The steps of FIG. 3 are described with reference to components discussed in FIG. 2.

In block 302, local variations of regional stress are determined using formation data detected by sensors. The local variations of regional stress, or local stress variations, can represent a natural fracture network in a region. The formation data can be detected and received by the well optimization system 120 from various sensors, as described in FIG. 1. The formation data can include seismic data and image logs that can be used to build the natural fracture network. The formation data received by the well optimization system can be used by the well optimization system 120 to determine a natural fracture network within the subterranean formations.

Local stress variation, which can be referred to as differential stress, can be determined using numerical solvers, such as a Material Point Method-based algorithm, or other solid mechanics approaches including Finite Element Method or Displacement Discontinuity Method. Using the natural fracture network alongside the regional stress information, the local stress variation can be simulated by the well optimization system 120. The local stress variation can be the result of fractures within the subterranean formations as well as formation properties.

The local stress variation can be output from the well optimization system 120 in the form of two-dimensional or three-dimensional representations or models of the subterranean formation. The local stress variation can be analyzed over time when applying constraints on the model. For example, inputs to the local stress variation model can include global regional stress, and dimensions and locations of fractures identified within the natural fracture network. By default, the local stress variation model determined by any of the numerical solvers can be in a state of disequilibrium. The numerical solvers can then analyze the local stress variation model over time until a state of equilibrium is reached. The output of the numerical solver used can be the local stress variation determined upon reaching a stable point in the local stress variation model.

Local stress variation can be used to indicate fracture geometry within a subterranean formation. High local stress variation can indicate straighter fractures within the subterranean formation. Low stress variation can indicate more branching fractures. The efficiency of fracturing in a well can be maximized by targeting zones of low local stress variation and avoiding zones of high local stress variation.

In block 304, a quality index for at least one area in the region is generated by combining the local variations of regional stress and at least one petrophysical property that is computed for the region. In some examples, the formation data can include petrophysical properties, such as porosity and permeability. The quality index can be generated by the well optimization system 120 and stored in a memory of the well optimization system 120.

A quality index can define one or more relationships between variables. For example, mapping three-dimensional petrophysical properties to local stress variation can create an index relating the three-dimensional petrophysical properties to local stress variation. The quality index combining the petrophysical properties with the local stress variation can define a relationship that is proportional to the porosity and the absolute permeability of a reservoir, but is inversely proportional to the local stress variation. The quality index can therefore be used to target areas with minimal local stress variation that can be more favorable to fracture propagation in all directions. For purposes of this disclosure, a lower quality index can represent a low permeability and porosity and a high local stress variation, and a higher quality index can represent a high permeability and porosity and a low local stress variation. Parameters of permeability, porosity, and local stress variation representing a low quality index can be ignored, and parameters representing a high quality index can be targeted for use in further steps to achieve an optimized well configuration.

In one example, a quality index can be calculated for each cell using the following formula.

$$QI = \alpha_1 \Phi + \alpha_2 \nu + \alpha_3 \Delta\sigma \begin{cases} \{\Phi, \nu, \Delta\sigma\} \in R^3 \\ \alpha_1 + \alpha_2 + \alpha_3 = 1 \end{cases} \quad (1)$$

In block 306, flow simulations for hydrocarbon recovery of simulated wellbores in the region are generated by generating well configuration models for areas in the region using the quality index. Generating the flow simulations can include the processes described in blocks 301, 303, 305, 307, which can be repeated for simulating flow in at least one well configuration model. The flow simulations can describe a projected flow of hydrocarbons over time for a given reservoir having a particular natural fracture network. The flow simulations can further describe how induced fracturing through drilling processes can affect the hydrocarbon recovery rate, such that new fractures can be made around and through existing natural fractures.

Generating the flow simulations for hydrocarbon recovery can include generating at least one well configuration model for areas in the region using the quality index generated in block 304. The threshold for determining what a low or high quality index is can be determined by a user operating the well optimization system 120, or by the well optimization system 120 automatically. Using a threshold can allow processes performed by the well optimization system 120 to focus on areas of high interest (e.g., areas with high porosity and permeability, and low local stress variation) that can maximize hydrocarbon recovery.

A well configuration model can include well locations and well geometries, defined by projected drill paths, for one or more simulated wells. In some examples, the well configuration model can be randomly generated. Parameters, such as well length, geographical orientation, borehole size, well angle, and other parameters related to a drill plan, can be received by the well optimization system 120. The well optimization system 120 can use these parameters as guidelines to randomly a well location and geometry in accordance with the guidelines. For example, a well configuration model can be given a number of user defined inputs, such as a well length and direction. The well optimization system 120 can randomly generate a number of projected wells, each having a location and geometry, for a single reservoir where the quality index is above the threshold. The result can be a number of randomly generated wells having a high quality index that adhere to the preset guidelines. For example, five wells may be included in the well configuration model that have a high enough quality index and that adhere to the physical well limitation. As a further example, the well limitations can be changed to be in a different direction, or at a shorter well length or depth. The well optimization system 120 may then project a well configuration model having three wells with a high enough quality index that adhere to the physical well limitations.

In some examples, the well configurations models can be generated based on user-selected parameters defining the physical characteristics of a planned well. An experimental design technique can be used as an alternative to or in conjunction with randomly generating the well configuration model. The experimental design technique can include selecting precise and several combinations of the physical well parameters, such as well length, well angle, drilling trajectory, geographical orientation, and borehole size, among other wellbore design parameters. Multiple well parameters can be selected to narrow the options for a viable well placement and configuration. This technique can improve viable well configuration models compared to random generation if enough well parameters are expertly selected.

For each well configuration model of the well configuration models generated, multiple processes can be performed to determine a projected hydrocarbon recovery rate for each well configuration model. In block 301, a reservoir geomechanical model is generated for a geomechanical parameter that includes propagation characteristics of hydraulic fractures. The propagation characteristics of hydraulic fractures can represent how hydrocarbons within a subterranean formation can flow, or propagate, throughout the formation. The reservoir geomechanical model can be a three-dimensional model mapping a geomechanical parameter of the reservoir and surrounding formations. The reservoir geomechanical model can be defined by a number of stages and the lag between each of the stages. In some examples, the reservoir geomechanical model can be a stress model, a pore pressure model, or other types of models useable to map rock properties such as rock strength in a three-dimensional format with respect to time.

For example, the reservoir geomechanical model can be a strain model. Regions of high strain, as illustrated by a strain model, can be of more interest than regions of low strain, since regions of high strain can increase the chances for fractures to propagate. The strain model can be used to determine regions of high strain for each proposed well in the well configuration model. For example, if the well configuration model included five wells to be potentially implemented, the strain model can determine zones of high strain and therefore high chance for fracture propagation for each of the five wells.

In block 303, new hydraulic fractures are determined by simulating propagation through the hydraulic fractures of the reservoir geomechanical model and by using geomechanical rules. The new hydraulic fractures can represent the anticipated branching of existing natural fractures during the fracturing process when drilling a well. New fractures can be added to the well configuration model corresponding to the propagated hydraulic fractures using defined geomechanical rules including constraints on fracture placement. In some examples, existing propagated hydraulic fractures can be adjusted based on the geomechanical rules used by the well optimization system 120.

Geomechanical rules can be predefined to determine a fracture that is likely to branch and therefore more readily produce hydrocarbons. A geomechanical rule can be a rule in a routine of rulesets used to refine a well configuration model based on restrictions or thresholds for geomechanical parameters. For example, a geomechanical rule can define the amount of pressure used during the fracturing process. The well optimization system 120 can analyze the adjusted hydraulic fractures over time to determine how the fracture responds when applied with a certain amount of pressure in a given direction. If the fracture is in a region were local stress variation is high, then the well optimization system 120, based on the geomechanical rule, can continue a next step of exerting more pressure within the simulation to further branch out the fracture. The well optimization system 120 can simulate hydraulic fracturing propagation in multiple iterations, such that the total amount of pressure exerted on the fractures can be decreased until pressure is equal to zero.

In block 305, the projected hydrocarbon recovery rate is determined by simulating flow with the new hydraulic fractures. Fluid flow analysis can determine how the new hydraulic fractures can cause a projected hydrocarbon recovery rate for each well configuration generated. Natural fractures can also be used in the flow simulation model to determine the projected hydrocarbon recovery rate. The flow simulation performed by the well optimization system 120 can analyze the natural and adjusted hydraulic fractures to determine a projected hydrocarbon recovery rate over a period. Inputs to the full physics flow simulation can include porosity, permeability, pressure-volume-temperature tables, and simulation time.

In block 307, the well optimization system 120 can determine if there are additional well configuration models available. If determined that additional possible well configuration models can be generated that have not yet been generated, the processes described in blocks 301, 303, 305, and 307 can be repeated. Repeating the processes can determine multiple projected hydrocarbon recovery rates for multiple well configuration models. The processes described in blocks 301, 303, 305, and 307 can be repeated to increase the number of available well configuration models useable to determine an optimized well configuration plan. Generating additional well configuration models can help determine an optimized well configuration, where an optimized well configuration can be determined by analyzing commonalities across each of the well configuration models. Each of the additionally generated well configurations can have a projected hydrocarbon recovery rate. In some examples, a maximum number of generated well configurations can be set, such that the well optimization system 120 can generate a predetermined number of well configuration models and corresponding projected hydrocarbon recovery rates.

In block 308, a well placement plan for a well in the region is selected using projected hydrocarbon recovery rates from the well configuration models. The well optimization system 120 can use the projected hydrocarbon recovery rates determined in block 306 to determine and select an optimized well placement plan, as described by some examples. The well placement plan can include a well location with respect to the local area in the region, a well geometry describing how the wellbore is designed to permeate the subterranean formation, and other wellbore parameters used for drilling and production phases.

In some examples, a machine-learning model can be used to select the well placement plan. A teaching set can be generated using the projected hydrocarbon recovery rates and the well configuration models. A machine-learning model can be taught using the teaching set. The machine-learning model can be configured to output hydrocarbon recovery rates corresponding to each of the well configuration models. The well configuration models can be analyzed using an optimizer and the machine-learning model to determine a well placement plan having a highest projected hydrocarbon recovery rate. In some examples, selecting the well placement plan can include building a response surface using the projected hydrocarbon recovery rates and the well configuration models, and analyzing the response surface using a minimization algorithm to determine the well placement plan having a highest projected hydrocarbon recovery rate.

In block 310, the well placement plan that is selected is output. The well placement plan can be used to plan one or more wellbores in the region. The well placement plan can be generated by the well optimization system 120 that can output the well placement plan to a display device or to other devices. In some examples, the well optimization system 120 can output the well placement plan to a user for implementation of the plan in an actual well planning and drilling environment.

In some examples, the well optimization system 120 can cause an operating characteristic of a well tool to be adjusted based on the well placement plan. For example, the well placement plan can include a certain geometry. During drilling, it may be determined that the drill bit has veered off the designated target drilling course. The well optimization system 120 can compare the real-time location of the drill bit against the well placement plan to determine if an operating characteristic of the drill bit needs to be adjusted to force the drill bit trajectory to more closely adhere to the well placement plan.

In some examples, the well optimization system 120 can cause an operating characteristic of a well tool to be adjusted based on the optimized well configuration having an optimized projected hydrocarbon recovery rate. The optimized well configuration can be defined by a well placement plan determined by the well optimization system 120. Changing an operating characteristic of a well tool can be implemented in the drilling of a new well, such that the drill plan is adjusted based on the optimized well configuration, or during the drilling of a current well to adhere to the well geometry defined by the optimized well configuration when the drilling is not on course. For example, the well optimization system 120 can cause a well tool setting, wellbore characteristic, or both to be adjusted in order to manipulate the drill string, drill bit, wireline tool, or other downhole device.

The well optimization system 120 can cause these adjustments to be made by transmitting commands to one or more well tools or using other techniques. An operating characteristics of a well tool can include rate of penetration, drilling fluid flow and pressure, rate of conveyance into the borehole, a revolution-per-minute value of a rotating well tool (e.g., drill string, drill bit), among other things. In some examples, petrochemical properties measured within a well being drilled actively can be used as continuous inputs to the well optimization system 120. In these examples, the optimized well configuration may be adjusted based on the parameters measured downhole. An adjustment to the optimized well configuration, such as a change drilling direction, can be determined by the well optimization system 120, which can cause an operating characteristic of one or more well tools to adjust in real time based on the change in the optimized well configuration.

Figure 4:
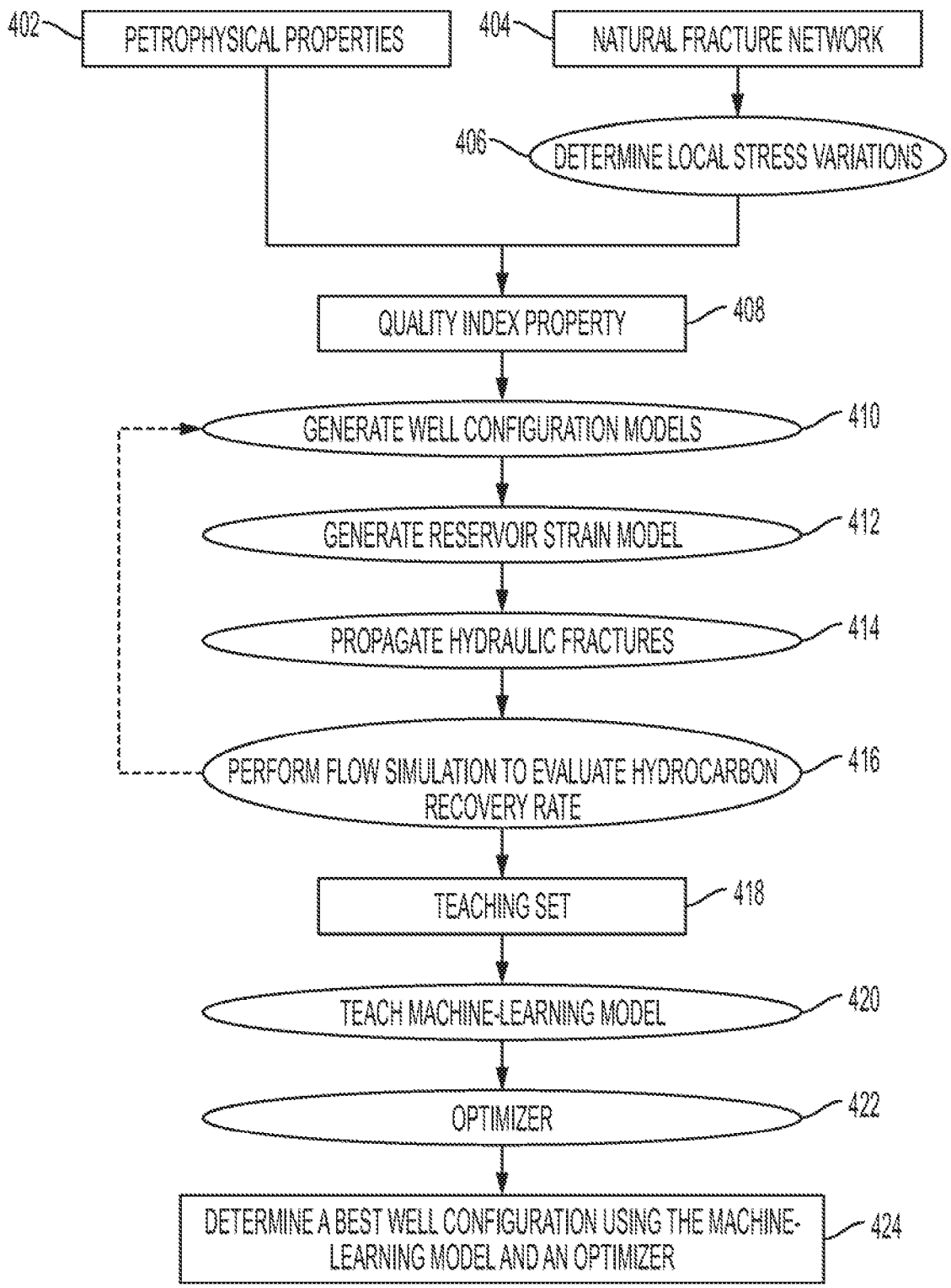
FIG. 4 is a data flow diagram of an example of a process for planning a well in a subterranean formation using an optimizer according to some aspects of the present disclosure.

FIG. 4 is data flow diagram of a process for planning a well in a subterranean formation using an optimizer according to some examples of the present disclosure. Other examples can include more steps, fewer steps, different steps, or a different order of the steps described with respect to FIG. 4. The steps of FIG. 4 are described with reference to components discussed in FIG. 2. The processes described in FIG. 4 can be an example implementation of the processes described by FIG. 3.

At block 402, three-dimensional petrophysical properties for a local area within a geographical region are determined. Formation data such as seismic data for a region having subterranean formations or wellbore image logs can be received from one or more sensors. The formation data can be received by the well optimization system 120 from various sensors, as described in FIG. 1. The formation data can be used to map the three-dimensional characteristics and petrophysical properties throughout a geographical region. The geographical region mapped by the sensors can subterranean formations having one or more reservoirs for which the well optimization system can produce an optimized well configuration, where each optimized well configuration can include projected locations and geometries for one or more wells to be drilled.

At block 404, a natural fracture network for the local area is determined. The formation data received by the well optimization system 120 can be used by the well optimization system 120 to determine a natural fracture network within the subterranean formations. In some examples, the well optimization system 120 can receive properties that define a natural fracture network, where those properties can be sourced separate from using the formation data to determine the natural fracture network. Planning a best well configuration can include drilling with respect to the natural fracture network to initiate more easily the flow of hydrocarbons from a reservoir, therefore increased well efficiency and increased hydrocarbon recovery rates.

At block 406, a local stress variation for a local area within the region is determined based on the natural fracture network and regional stress information. The regional stress information can correspond to stress variation within the subterranean formations located across the region. Regional stress information can be received by the well optimization system 120. The regional stress information can be determined using the sensors, such that regional stress information can be consistent throughout a geographical area. The local variations of regional stress can be determined by the well optimization system 120 using a Material Point Method-based algorithm, or other solid mechanics approaches including Finite Element Method or Displacement Discontinuity Method.

At block 408, a quality index having a quality index property is generated by combining the petrophysical properties and the local stress variation. The formation data, including three-dimensional petrophysical properties of the reservoir, gathered in block 402 and the local stress variation determined in block 406 can be used to generate a quality index. The quality index can be generated according to some of the examples. The property of the quality index can refer to a mapped relationship between the local stress variation and the petrophysical properties. In some examples, the property of the quality index can refer to a threshold value of the quality index as described in some examples, such that the threshold value can be used to separate well configuration models with high-yielding projected hydrocarbon production rates from well configuration models with low-yielding projected hydrocarbon production rates.

At block 410, a well configuration model for the local area is randomly generated based on the quality index. A threshold can be used to target parameter relationships of the quality index having a high quality index, while disregarding parameter relationships having a low quality index. The quality index can be attributed a threshold value such that well configurations of high projected hydrocarbon recovery can be targeted and well configurations of low projected hydrocarbon recovery can be disregarded in further processing. In some examples, the well configuration models can be randomly generated using the well optimization system 120.

At block 412, a reservoir geomechanical model for the well configuration is generated to determine hydraulic fractures that are most likely to propagate. The well configuration model generated in block 410 can be analyzed by the well optimization system 120 using a reservoir geomechanical model to identify zones where hydrocarbon recovery via fracturing is most feasible. In some examples, the reservoir geomechanical model can be a strain model, a stress model, or any type of model useable to map rock properties such as rock strength in a three-dimensional format with respect to time.

At block 414, new hydraulic fractures are determined in the reservoir geomechanical model based on the hydraulic fractures determined in block 412 and geomechanical rules. New fractures can be added to the well configuration model corresponding to the propagated hydraulic fractures using defined geomechanical rules including constraints on fracture placement. In some examples, existing propagated hydraulic fractures can be adjusted based on the geomechanical rules used by the well optimization system 120. The well optimization system 120 can determine the location and geometry of each natural or hydraulic fracture.

At block 416, a projected hydrocarbon recovery rate for the well configuration model is determined by performing a flow simulation using the new hydraulic fractures determined in block 414. Natural fractures can also be used in the flow simulation model to determine the projected hydrocarbon recovery rate. The flow simulation performed by the well optimization system 120 can analyze the natural and adjusted hydraulic fractures to determine a projected hydrocarbon recovery rate over a period.

The processes described by blocks 410 through 416 can be repeated to determine multiple projected hydrocarbon recovery rates for using multiple well configuration models. The processes described in blocks 410 through 416 can be repeated to increase the number of available well configuration models useable to determine an optimized well configuration plan. Generating additional well configuration models can help understand an optimized well configuration, where an optimized well configuration can be determined by analyzing commonalities across each of the well configuration models. Each of the additionally generated well configurations can have a projected hydrocarbon recovery rate.

In block 418, a teaching set is built using the flow simulations determined in block 416. The multiple well configuration models having projected hydrocarbon recovery rates can be used to develop a teaching set for application in a machine-learning model (e.g., neural network, deep learning algorithm, etc.) implemented by the well optimization system 120. The teaching set can include any of the parameters used in the processes described in block 402 through 414, such as number of wells, projected well geometry, well location, adjusted hydraulic fracture configuration, fluid properties, petrophysical properties, porosity, permeability, the natural fracture framework, and projected hydrocarbon recovery rates, strain, among other things.

In block 420, a machine-learning model is taught using the teaching set determined in block 418. The teaching set can be used to teach the machine-learning model to determine relationships between parameters described above, such that certain parameters may be given more weights than other parameters and can be more influential in determining the output of the machine-learning model. The machine-learning model can define relationships between the various parameters that can be used to predict the hydrocarbon recovery rates for any well configuration. For example, strain can be more influential for shale reservoirs, and therefore may be given more weight within the machine-learning model based on the relationships defined in the teaching set. The machine-learning model can be taught using additional teaching sets determined from other reservoirs within a geographical region.

The output of the machine-learning model can be the projected hydrocarbon recovery rate based on inputs including all the parameters described above. The machine-learning model can be used to determine thousands or millions of projected hydrocarbon recovery rates corresponding to an equivalent number of well configuration models. Given a number of set inputs, the machine-learning model can output one or more projected hydrocarbon recovery rates corresponding to one or more well configuration models.

In block 424, a best well configuration is determined using the machine-learning model and an optimizer. The well optimization system 120 can include an optimizer. The well optimization system 120 can input the projected hydrocarbon recovery rates and the well configuration models into the optimizer in block 422 to determine which of the projected hydrocarbon recovery rates and well configuration models can maximize recovery for a given reservoir. The optimizer can input parameters specific to the reservoir targeted for optimization into the machine-learning model taught in block 420, and the machine-learning model may output multiple available well configuration models, each with projected hydrocarbon recovery rates. The optimizer can be configured to choose the most suitable well configuration model from the available well configuration models based on the projected hydrocarbon recovery rates output by the machine-learning model, in addition to other factors, such as well cost, well integrity, production time, and other factors important in achieving efficient well operations. The optimizer can define these well factors to determine which of the well configurations can produce the maximum amount of hydrocarbons while simultaneously adhering to user-defined physical constraints.

By using a machine-learning mode in conjunction with an optimizer to determine a maximized projected hydrocarbon recovery rate, the processes described in blocks 406 through 420 can be avoided for further determinations of planning a best well configuration. Once the machine-learning model is initiated, it can be used to predict the relationships between the parameters continuously to determine projections and well configurations for different reservoirs.

In some examples, the teaching set can include data measured from existing wells for a reservoir. Thus, the machine-learning model can be taught to produce more accurate results with respect to a specific application. In some examples, the machine-learning model can be updated as more historical data pertaining to existing wells becomes available. For example, the machine-learning model can determine an optimized well configuration including multiple proposed wells. A first of the proposed well can be drilled and completed, then real world petrophysical properties can be measured within that first well. The teaching set can include the measured petrophysical properties to refine the machine-learning model further.

Figure 5:
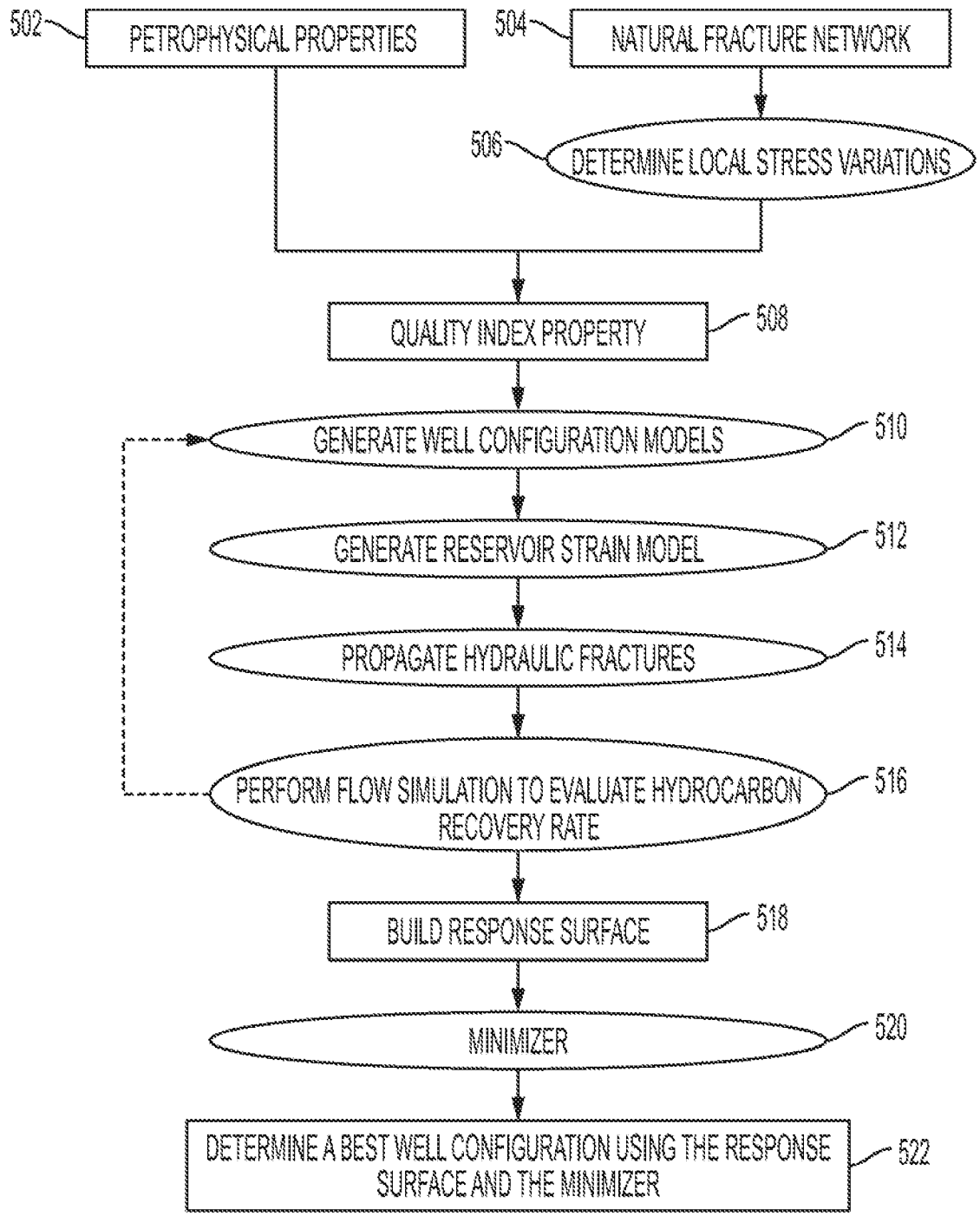
FIG. 5 is a data flow diagram of an example of a process for planning a well in a subterranean formation using a minimizer according to some aspects of the present disclosure.

FIG. 5 is a data flow diagram of a process for planning a well in a subterranean formation using a minimizer according to some examples of the present disclosure. Other examples can include more steps, fewer steps, different steps, or a different order of the steps described with respect to FIG. 5. The processes described in FIG. 5 can be similar to those as described in FIG. 4. For example, the processes in blocks 502 through 508 can be the same as or similar to the processes described in blocks 402 through 408 respectively. The processes described in FIG. 5 can be an example implementation of the processes described by FIG. 3.

In block 510, several well configuration models for an area are generated based on the quality index determined in block 508. In some examples, an experimental design technique can be used as an alternative to or in conjunction with randomly generating the well configuration model. The experimental design technique can include selecting precise and several combinations of the physical well parameters, such as well length, well angle, drilling trajectory, geographical orientation, and borehole size. Multiple well parameters can be selected to narrow the options for a viable well placement and configuration. This technique can improve viable well configuration models compared to random generation if enough well parameters are expertly selected.

The processes described in blocks 512 through 516 can be the same as or similar to the processes described in blocks 412 through 416 respectively.

In block 518, a response surface is built using the flow simulations determined in block 516. In some examples, such as when using an experimental design technique to generate a well configuration model as described in block 510, a response surface can be used to determine an optimized well configuration having a maximized projected hydrocarbon recovery rate. The response surface can be built as an alternative to or in conjunction with the machine-learning model described in examples in FIG. 4. The response surface can be built using the well configuration models and corresponding projected hydrocarbon recovery rates. The response surface can map relationships between the various parameters used in blocks 502 through 516 with well configuration models and projected hydrocarbon recovery rates. Based on these defined relationships, the response surface can predict a response (e.g., projected hydrocarbon recovery rate) for any well configuration model.

In block 520, a best well configuration is determined using the response surface determined in block 518 and a minimizer. The well optimization system 120 can include a minimizer. The well optimization system 120 can input the flow simulations and corresponding well configuration models into the minimizer in block 520 to determine a best well configuration. The minimizer can include a minimization technique that can be an algorithm used to determine an optimized well configuration having the highest achievable projected hydrocarbon recovery rate for any specific reservoir. The minimization technique can determine a projected well location and geometry plan that can achieve the highest possible hydrocarbon recovery while using the least amount of resources. For example, the minimization technique can determine, from the flow simulations for each well configuration model generated in blocks 510 through 516, a well location and drill plan including a least amount of tubing and optimized tubing orientation needed to be used in obtaining the highest possible hydrocarbon recovery rate for a specific reservoir.

Figure 6:
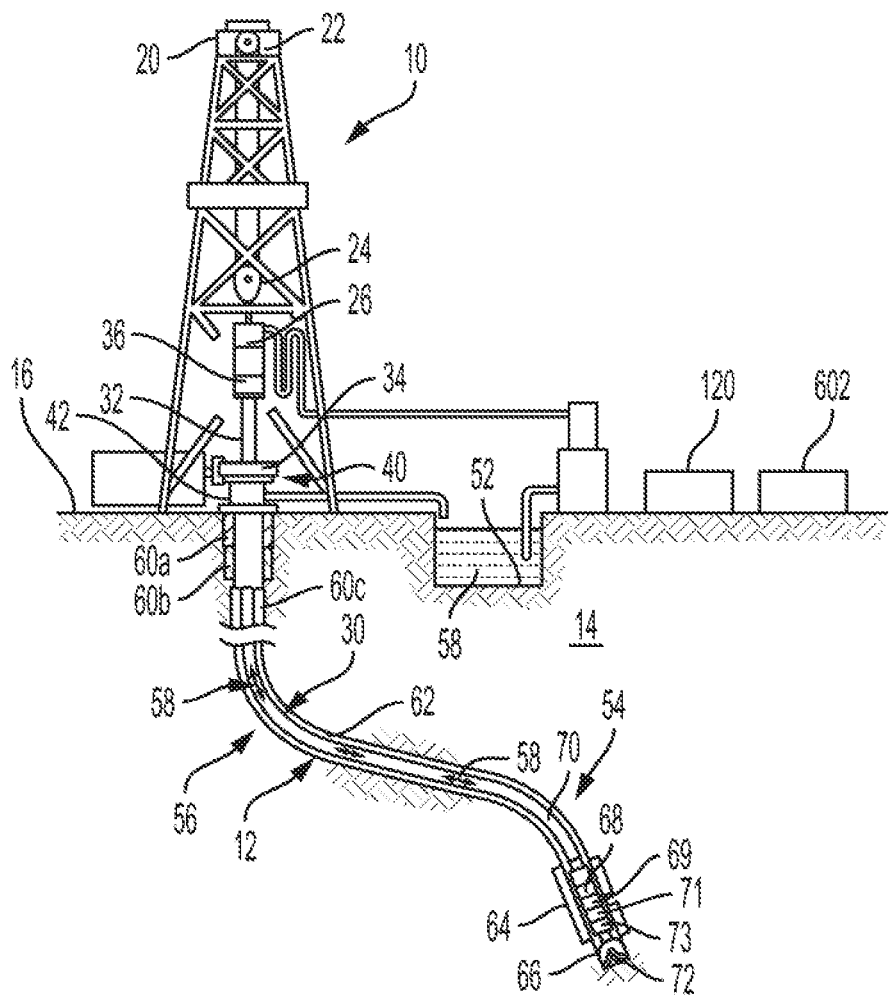
FIG. 6 is a schematic of an example of a well drilled according to a plan developed from a well optimization system according to one aspect of the present disclosure.

FIG. 6 is a schematic of a well 10 drilled according to a plan developed from a well optimization system 120 according to some examples of the present disclosure. In some examples, the well system 10 can be a preexisting well system that can be used to measure petrophysical properties of a targeted reservoir. A sensor 602 and measurement equipment 73 located downhole can be used to measure properties of a formation 14. The sensor 602 can be used to determine formation data and the measurement equipment 73 can be used to determine petrophysical properties corresponding to the formation 14. These petrophysical properties can be used by the well optimization system 120 located at a well surface 16 to determine optimized well placements and geometries for additional wells for retrieving hydrocarbons from the same targeted reservoir. In some examples, the placement and drilling path of the well system 10 can be a result of determining additional optimal well configurations for a reservoir already producing hydrocarbons, such that the well optimization system 120 can determine the configuration of the well system 10 based on petrophysical measurements recorded in existing wells in a same reservoir. In some examples, the placement and drilling path of the well system 10 can be a result of a fully simulated well optimization procedure performed by the well optimization system 120, such that the well system 10 is one of the planned wells based on the flow simulations and projected hydrocarbon recovery rates of generated well configuration models.

The well system 10 can include a wellbore 12 extending through various earth strata in an oil and gas formation 14 (e.g., a subterranean formation) located below the well surface 16. The wellbore 12 may be formed of a single bore or multiple bores extending into the formation 14, and disposed in any orientation. The well system 10 can include a derrick or drilling rig 20. The drilling rig 20 may include a hoisting apparatus 22, a travel block 24, and a swivel 26 for raising and lowering casing, drill pipe, coiled tubing, and other types of pipe or tubing strings or other types of conveyance vehicles, such as wireline, slickline, and the like. The wellbore 12 can include a drill string 30 that is a substantially tubular, axially-extending drill string formed of a drill pipe joints coupled together end-to-end.

The drilling rig 20 may include a kelly 32, a rotary table 34, and other equipment associated with rotation or translation of drill string 30 within the wellbore 12. For some applications, the drilling rig 20 may also include a top drive unit 36. The drilling rig 20 may be located proximate to a wellhead 40, as shown in FIG. 6, or spaced apart from the wellhead 40, such as in the case of an offshore arrangement. One or more pressure control devices 42, such as blowout preventers ("BOPs") and other well equipment may also be provided at wellhead 40 or elsewhere in the well system 10. Although the well system 10 of FIG. 6 is illustrated as being a land-based drilling system, the well system 10 may be deployed offshore.

A drilling or service fluid source 52 may supply a drilling fluid 58 pumped to the upper end of the drill string 30 and flowed through the drill string 30. The drilling fluid source 52 may supply any fluid utilized in wellbore operations, including drilling fluid, cement slurry, acidizing fluid, liquid water, steam or some other type of fluid.

The well system 10 may have a pipe system 56. For purposes of this disclosure, the pipe system 56 may include casing, risers, tubing, drill strings, subs, heads or any other pipes, tubes or equipment that attaches to the foregoing, such as the drill string 30, as well as the wellbore and laterals in which the pipes, casing, and strings may be deployed. In this regard, the pipe system 56 may include one or more casing strings 60 cemented in the wellbore 12, such as the surface 60a, intermediate 60b, and other casing strings 60c shown in FIG. 6. An annulus 62 is formed between the walls of sets of adjacent tubular components, such as concentric casing strings 60 or the exterior of drill string 30 and the inside wall of the wellbore 12 or the casing string 60c.

Where the subsurface equipment 54 is used for drilling and the conveyance vehicle is a drill string 30, the lower end of the drill string 30 may include a bottom hole assembly 64, which may carry at a distal end a drill bit 66. During drilling operations, a weight-on-bit is applied as the drill bit 66 is rotated, thereby enabling the drill bit 66 to engage the formation 14 and drill the wellbore 12 along a predetermined path toward a target zone. In general, the drill bit 66 may be rotated with the drill string 30 from the drilling rig 20 with the top drive unit 36 or the rotary table 34, or with a downhole mud motor 68 within the bottom hole assembly 64. The direction, rate-of-penetration, and other drilling parameters can be predetermined or continuously updated according to a drilling plan. The drilling plan can be developed based on an optimized well configuration determined by the well optimization system 120 as described by examples. The drilling plan can include a well location and well geometry, such that the location of the drilling rig 20 can be chosen based on the projected well optimization and the drill path of the drill bit 66 can follow the projected well geometry throughout the formation 14.

The bottom hole assembly 64 or the drill string 30 may include various other tools, including a power source 69, mechanical subs 71 such as directional drilling subs, and measurement equipment 73, such as measurement while drilling (MWD) or logging while drilling (LWD) instruments, sensors, circuits, or other equipment to provide information about the wellbore 12 or the formation 14, such as logging or measurement data from the wellbore 12.

Measurement data and other information from the tools may be communicated using electrical signals, acoustic signals, or other telemetry that can be received at the well surface 16 to, among other things, monitor the performance of the drill string 30, the bottom hole assembly 64, and the associated drill bit 66, as well as monitor the conditions of the environment to which the bottom hole assembly 64 is subjected (e.g., drilling fluid 58 flow rate). For example, the measurement equipment can be exposed to hydrocarbons in a reservoir to determine petrophysical properties that can be transmitted to the well optimization system 120 to determine an additional well configuration.

The well optimization system 120 can determine a number of well placements having certain geometries specific to a reservoir. In some examples, the well optimization system 120 can continuously update the optimized well configuration having multiple wells with corresponding projected hydrocarbon recovery rates after one or more of the wells is drilled or enters the production phase. For example, a first well of the optimized well configuration can be planned, drilled, and enter the production phase. Actual petrophysical measurements of the reservoir as determined by one or more sensors of the first well in the drilling and production phases can be used as input to the well optimization system 120. Using the actual petrophysical properties measured in the first well, the optimized well configuration can be updated, such that the actual well location, geometry, or hydrocarbon recovery rate differs from the projected well location, geometry, or hydrocarbon recovery rate.

By taking into account the actual parameter and configuration of the first well instead of the originally projected parameters and configuration, the optimized well configuration can be updated. Subsequently, a second well, optimized a second time based on the actual parameters of the first well, can be drilled and enter production phase. The optimized well configuration can be adjusted based on the first well parameters and the second well parameters to determine an updated configuration for a third well, such that the original projection of the third well changed based on the real world implementation of the first well and second well. This can allow for further refinement of the well configuration to maximize the achievable hydrocarbon recovery rate more so than drilling all wells of the projected optimized well configuration at the same time.

As used below, any reference to a series of examples is to be understood as a reference to each of those examples disjunctively (e.g., "Examples 1-4" is to be understood as "Examples 1, 2, 3, or 4").

In some aspects, systems, devices, and methods for planning a configuration of a wellbore in a subterranean formation based on geomechanical parameters are provided according to one or more of the following examples:

Example 1 is a system comprising: a processing device; and a non-transitory computer-readable medium including program code that is executable by the processing device for causing the processing device to: determine local variations of regional stress using formation data detected by sensors and representing a natural fracture network in a region; generate a quality index for at least one area in the region by combining the local variations of regional stress and at least one petrophysical property that is computed for the region; generate a plurality of flow simulations for hydrocarbon recovery of simulated wellbores in the region by: generating, using the quality index, a plurality of well configuration models for areas in the region; for each well configuration model of the plurality of well configuration models, generate a reservoir geomechanical model for a geomechanical parameter that includes propagation characteristics of hydraulic fractures; determine new hydraulic fractures by simulating propagation through the hydraulic fractures of the reservoir geomechanical model and using geomechanical rules; and determine a projected hydrocarbon recovery rate by simulating flow with the new hydraulic fractures; select a well placement plan for a well in the region using a plurality of projected hydrocarbon recovery rates from the plurality of well configuration models; and output the well placement plan that is selected and that is usable to plan one or more wellbores in the region.

Example 2 is the system of example 1, wherein the non-transitory computer-readable medium includes program code that is executable by the processing device for causing the processing device to select the well placement plan by: generating a teaching set using the plurality of projected hydrocarbon recovery rates and the plurality of well configuration models; teaching, using the teaching set, a machine-learning model to output hydrocarbon recovery rates corresponding to well configuration models; and analyzing the plurality of well configuration models using an optimizer and the machine-learning model to determine the well placement plan among a plurality of well placement plans having a highest projected hydrocarbon recovery rate.

Example 3 is the system of any of examples 1-2, wherein the non-transitory computer-readable medium includes program code that is executable by the processing device for causing the processing device to select the well placement plan by: building a response surface using the plurality of projected hydrocarbon recovery rates and the plurality of well configuration models; and analyzing the response surface using a minimization algorithm to determine the well placement plan among a plurality of well placement plans having a highest projected hydrocarbon recovery rate.

Example 4 is the system of any of examples 1-3, wherein the non-transitory computer-readable medium includes program code that is executable by the processing device for causing the processing device to determine the local variations of regional stress by simulating the local variations of regional stress using a material point method-based algorithm.

Example 5 is the system of any of examples 1-4, wherein the non-transitory computer-readable medium includes program code that is executable by the processing device for causing the processing device to generate the plurality of well configuration models by randomly generating the well configuration models, wherein randomly generating the well configuration models includes randomly selecting a well geometry from any possible well geometries.

Example 6 is the system of any of examples 1-5, wherein the formation data includes seismic data or image logs that represent the at least one petrophysical property that includes porosity or permeability of the at least one area.

Example 7 is the system of any of examples 1-6, wherein the well placement plan includes a well location and well geometry.

Example 8 is a non-transitory computer-readable medium including program code that is executable by a processing device for causing the processing device to: determine local variations of regional stress using formation data detected by sensors and representing a natural fracture network in a region; generate a quality index for at least one area in the region by combining the local variations of regional stress and at least one petrophysical property that is computed for the region; generate a plurality of flow simulations for hydrocarbon recovery of simulated wellbores in the region by: generating, using the quality index, a plurality of well configuration models for areas in the region; for each well configuration model of the plurality of well configuration models, generate a reservoir geomechanical model for a geomechanical parameter that includes propagation characteristics of hydraulic fractures; determine new hydraulic fractures by simulating propagation through the hydraulic fractures of the reservoir geomechanical model and using geomechanical rules; and determine a projected hydrocarbon recovery rate by simulating flow with the new hydraulic fractures; select a well placement plan for a well in the region using a plurality of projected hydrocarbon recovery rates from the plurality of well configuration models; and output the well placement plan that is selected and that is usable to plan one or more wellbores in the region.

Example 9 is the non-transitory computer-readable medium of example 8, wherein the non-transitory computer-readable medium includes program code that is executable by the processing device for causing the processing device to select the well placement plan by: generating a teaching set using the plurality of projected hydrocarbon recovery rates and the plurality of well configuration models; teaching, using the teaching set, a machine-learning model to output hydrocarbon recovery rates corresponding to well configuration models; and analyzing the plurality of well configuration models using an optimizer and the machine-learning model to determine the well placement plan among a plurality of well placement plans having a highest projected hydrocarbon recovery rate.

Example 10 is the non-transitory computer-readable medium of any of examples 8-9, wherein the non-transitory computer-readable medium includes program code that is executable by the processing device for causing the processing device to select the well placement plan by: building a response surface using the plurality of projected hydrocarbon recovery rates and the plurality of well configuration models; and analyzing the response surface using a minimization algorithm to determine the well placement plan among a plurality of well placement plans having a highest projected hydrocarbon recovery rate.

Example 11 is the non-transitory computer-readable medium of any of examples 8-10, wherein the non-transitory computer-readable medium includes program code that is executable by the processing device for causing the processing device to determine the local variations of regional stress by simulating the local variations of regional stress using a material point method-based algorithm.

Example 12 is the non-transitory computer-readable medium of any of examples 8-11, wherein the non-transitory computer-readable medium includes program code that is executable by the processing device for causing the processing device to generate the plurality of well configuration models by randomly generating the well configuration models, wherein randomly generating the well configuration models includes randomly selecting a well geometry from any possible well geometries.

Example 13 is the non-transitory computer-readable medium of any of examples 8-12, wherein the formation data includes seismic data or image logs that represent the at least one petrophysical property that includes porosity or permeability of the at least one area.

Example 14 is the non-transitory computer-readable medium of any of examples 8-13, wherein the well placement plan includes a well location and well geometry.

Example 15 is a computer-implemented method comprising: determining local variations of regional stress using formation data detected by sensors and representing a natural fracture network in a region; generating a quality index for at least one area in the region by combining the local variations of regional stress and at least one petrophysical property that is computed for the region; generating a plurality of flow simulations for hydrocarbon recovery of simulated wellbores in the region by: generating, using the quality index, a plurality of well configuration models for areas in the region; for each well configuration model of the plurality of well configuration models, generate a reservoir geomechanical model for a geomechanical parameter that includes propagation characteristics of hydraulic fractures; determine new hydraulic fractures by simulating propagation through the hydraulic fractures of the reservoir geomechanical model and using geomechanical rules; and determine a projected hydrocarbon recovery rate by simulating flow with the new hydraulic fractures; selecting a well placement plan for a well in the region using a plurality of projected hydrocarbon recovery rates from the plurality of well configuration models; and outputting the well placement plan that is selected and that is usable to plan one or more wellbores in the region.

Example 16 is the computer-implemented method of example 15, wherein selecting the well placement plan comprises: generating a teaching set using the plurality of projected hydrocarbon recovery rates and the plurality of well configuration models; teaching, using the teaching set, a machine-learning model to output hydrocarbon recovery rates corresponding to well configuration models; and analyzing the plurality of well configuration models using an optimizer and the machine-learning model to determine the well placement plan among a plurality of well placement plans having a highest projected hydrocarbon recovery rate.

Example 17 is the computer-implemented method of any of examples 15-16, wherein selecting the well placement plan comprises: building a response surface using the plurality of projected hydrocarbon recovery rates and the plurality of well configuration models; and analyzing the response surface using a minimization algorithm to determine the well placement plan among a plurality of well placement plans having a highest projected hydrocarbon recovery rate.

Example 18 is the computer-implemented method of any of examples 15-17, wherein determining the local variations of regional stress includes simulating the local variations of regional stress using a material point method-based algorithm, and wherein generating the plurality of well configuration models includes randomly generating the well configuration models, wherein randomly generating the well configuration models includes randomly selecting a well geometry from any possible well geometries.

Example 19 is the computer-implemented method of any of examples 15-18, wherein the formation data includes seismic data or image logs that represent the at least one petrophysical property that includes porosity or permeability of the at least one area.

Example 20 is the computer-implemented method of any of examples 15-19, wherein the well placement plan includes a well location and well geometry.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system comprising:
a processing device; and
a non-transitory computer-readable medium including program code that is executable by the processing device for causing the processing device to:
determine local variations of regional stress using formation data detected by sensors and representing a natural fracture network in a region;
generate a quality index for at least one area in the region by combining the local variations of regional stress and petrophysical properties that include a porosity that is computed for the region and a permeability that is computed for the region, wherein the quality index is a sum of the porosity adjusted by a first constant, the permeability adjusted by a second constant, and the local variations of regional stress adjusted by a third constant;
generate a plurality of flow simulations for hydrocarbon recovery of simulated wellbores in the region by:
generating, using the quality index, a plurality of well configuration models for areas in the region;
for each well configuration model of the plurality of well configuration models,
generate a reservoir geomechanical model for a geomechanical parameter that includes propagation characteristics of hydraulic fractures;
determine new hydraulic fractures by simulating propagation through the hydraulic fractures of the reservoir geomechanical model and using geomechanical rules; and
determine a projected hydrocarbon recovery rate by simulating flow with the new hydraulic fractures;
select a well placement plan for a well in the region using a plurality of projected hydrocarbon recovery rates from the plurality of well configuration models; and
output a command that causes an adjustment to a characteristic of a well tool based on the well placement plan that is selected.

2. The system of claim 1, wherein the non-transitory computer-readable medium includes program code that is executable by the processing device for causing the processing device to select the well placement plan by:
generating a teaching set using the plurality of projected hydrocarbon recovery rates and the plurality of well configuration models;
teaching, using the teaching set, a machine-learning model to output hydrocarbon recovery rates corresponding to well configuration models; and
analyzing the plurality of well configuration models using an optimizer and the machine-learning model to determine the well placement plan among a plurality of well placement plans having a highest projected hydrocarbon recovery rate.

3. The system of claim 1, wherein the non-transitory computer-readable medium includes program code that is executable by the processing device for causing the processing device to select the well placement plan by:
building a response surface using the plurality of projected hydrocarbon recovery rates and the plurality of well configuration models; and
analyzing the response surface using a minimization algorithm to determine the well placement plan among a plurality of well placement plans having a highest projected hydrocarbon recovery rate.

4. The system of claim 1, wherein the non-transitory computer-readable medium includes program code that is executable by the processing device for causing the processing device to determine the local variations of regional stress by simulating the local variations of regional stress using a material point method-based algorithm.

5. The system of claim 1, wherein the non-transitory computer-readable medium includes program code that is executable by the processing device for causing the processing device to generate the plurality of well configuration models by randomly generating the well configuration models, wherein randomly generating the well configuration models includes randomly selecting a well geometry from any possible well geometries.

6. The system of claim 1, wherein the formation data includes seismic data or image logs that represent the petrophysical properties.

7. The system of claim 1, wherein the operation of generate the quality index includes, for each area of the at least one area in the region:

$$QI = \alpha_1 \phi + \alpha_2 \nu + \alpha_3 \Delta\sigma$$

wherein $\phi$ is the porosity, $\nu$ is the permeability, and $\Delta\sigma$ is a negative of the local variations of regional stress of the area, and wherein $\alpha_1$, $\alpha_2$, and $\alpha_3$, are constants such that $\alpha_1 + \alpha_2 + \alpha_3 = 1$.

8. A non-transitory computer-readable medium including program code that is executable by a processing device for causing the processing device to:
determine local variations of regional stress using formation data detected by sensors and representing a natural fracture network in a region;
generate a quality index for at least one area in the region by combining the local variations of regional stress and petrophysical properties that include a porosity that is computed for the region and a permeability that is computed for the region, wherein the quality index is a sum of the porosity adjusted by a first constant, the permeability adjusted by a second constant, and the local variations of regional stress adjusted by a third constant;

generate a plurality of flow simulations for hydrocarbon recovery of simulated wellbores in the region by:

generating, using the quality index, a plurality of well configuration models for areas in the region;

for each well configuration model of the plurality of well configuration models, generate a reservoir geomechanical model for a geomechanical parameter that includes propagation characteristics of hydraulic fractures;

determine new hydraulic fractures by simulating propagation through the hydraulic fractures of the reservoir geomechanical model and using geomechanical rules; and determine a projected hydrocarbon recovery rate by simulating flow with the new hydraulic fractures;

select a well placement plan for a well in the region using a plurality of projected hydrocarbon recovery rates from the plurality of well configuration models; and output a command that causes an adjustment to a characteristic of a well tool based on the well placement plan that is selected.

9. The non-transitory computer-readable medium of claim 8, wherein the non-transitory computer-readable medium includes program code that is executable by the processing device for causing the processing device to select the well placement plan by:

generating a teaching set using the plurality of projected hydrocarbon recovery rates and the plurality of well configuration models;

teaching, using the teaching set, a machine-learning model to output hydrocarbon recovery rates corresponding to well configuration models; and analyzing the plurality of well configuration models using an optimizer and the machine-learning model to determine the well placement plan among a plurality of well placement plans having a highest projected hydrocarbon recovery rate.

10. The non-transitory computer-readable medium of claim 8, wherein the non-transitory computer-readable medium includes program code that is executable by the processing device for causing the processing device to select the well placement plan by:

building a response surface using the plurality of projected hydrocarbon recovery rates and the plurality of well configuration models; and analyzing the response surface using a minimization algorithm to determine the well placement plan among a plurality of well placement plans having a highest projected hydrocarbon recovery rate.

11. The non-transitory computer-readable medium of claim 8, wherein the non-transitory computer-readable medium includes program code that is executable by the processing device for causing the processing device to determine the local variations of regional stress by simulating the local variations of regional stress using a material point method-based algorithm.

12. The non-transitory computer-readable medium of claim 8, wherein the non-transitory computer-readable medium includes program code that is executable by the processing device for causing the processing device to generate the plurality of well configuration models by randomly generating the well configuration models, wherein randomly generating the well configuration models includes randomly selecting a well geometry from any possible well geometries.

13. The non-transitory computer-readable medium of claim 8, wherein the formation data includes seismic data or image logs that represent the petrophysical properties.

14. A computer-implemented method comprising:

determining local variations of regional stress using formation data detected by sensors and representing a natural fracture network in a region;

generating a quality index for at least one area in the region by combining the local variations of regional stress and petrophysical properties that include a porosity that is computed for the region and a permeability that is computed for the region, wherein the quality index is a sum of the porosity adjusted by a first constant, the permeability adjusted by a second constant, and the local variations of regional stress adjusted by a third constant;

generating a plurality of flow simulations for hydrocarbon recovery of simulated wellbores in the region by:

generating, using the quality index, a plurality of well configuration models for areas in the region;

for each well configuration model of the plurality of well configuration models, generate a reservoir geomechanical model for a geomechanical parameter that includes propagation characteristics of hydraulic fractures;

determine new hydraulic fractures by simulating propagation through the hydraulic fractures of the reservoir geomechanical model and using geomechanical rules; and determine a projected hydrocarbon recovery rate by simulating flow with the new hydraulic fractures;

selecting a well placement plan for a well in the region using a plurality of projected hydrocarbon recovery rates from the plurality of well configuration models; and outputting a command that causes an adjustment to a characteristic of a well tool based on the well placement plan that is selected.

15. The computer-implemented method of claim 14, wherein selecting the well placement plan comprises:

generating a teaching set using the plurality of projected hydrocarbon recovery rates and the plurality of well configuration models;

teaching, using the teaching set, a machine-learning model to output hydrocarbon recovery rates corresponding to well configuration models; and analyzing the plurality of well configuration models using an optimizer and the machine-learning model to determine the well placement plan among a plurality of well placement plans having a highest projected hydrocarbon recovery rate.

16. The computer-implemented method of claim 14, wherein selecting the well placement plan comprises:

building a response surface using the plurality of projected hydrocarbon recovery rates and the plurality of well configuration models; and analyzing the response surface using a minimization algorithm to determine the well placement plan among a plurality of well placement plans having a highest projected hydrocarbon recovery rate.

17. The computer-implemented method of claim 14, wherein determining the local variations of regional stress includes simulating the local variations of regional stress using a material point method-based algorithm, and wherein generating the plurality of well configuration models includes randomly generating the well configuration models, wherein randomly generating the well configuration models includes randomly selecting a well geometry from any possible well geometries.

18. The computer-implemented method of claim 14, wherein the formation data includes seismic data or image logs that represent the petrophysical properties.

\* \* \* \* \*